United States Patent
Sakai et al.

(10) Patent No.: US 11,251,774 B2
(45) Date of Patent: Feb. 15, 2022

(54) QUARTZ CRYSTAL RESONATOR UNIT

(71) Applicant: Murata Manufacturing Co., Ltd., Nagaokakyo (JP)

(72) Inventors: Motoyoshi Sakai, Nagaokakyo (JP); Hiroaki Kaida, Nagaokakyo (JP)

(73) Assignee: MURATA MANUFACTURING CO., LTD.., Nagaokakyo (JP)

( * ) Notice: Subject to any disclaimer, the term of this patent is extended or adjusted under 35 U.S.C. 154(b) by 108 days.

(21) Appl. No.: 16/799,008

(22) Filed: Feb. 24, 2020

(65) Prior Publication Data
US 2020/0195225 A1 Jun. 18, 2020

Related U.S. Application Data

(63) Continuation of application No. PCT/JP2018/030254, filed on Aug. 14, 2018.

(30) Foreign Application Priority Data

Sep. 1, 2017 (JP) .............................. JP2017-168783

(51) Int. Cl.
*H03H 9/19* (2006.01)
*H03H 9/10* (2006.01)
*H03H 9/13* (2006.01)

(52) U.S. Cl.
CPC ............ *H03H 9/19* (2013.01); *H03H 9/1035* (2013.01); *H03H 9/13* (2013.01)

(58) Field of Classification Search
CPC .......... H03H 9/19; H03H 9/0552; H03H 9/10; H03H 9/132; H03H 9/05; H03H 9/02094; H03H 9/1035; H03H 9/02
See application file for complete search history.

(56) References Cited

U.S. PATENT DOCUMENTS

2012/0032561 A1* 2/2012 Mizusawa ............ H03H 9/0595
310/344

FOREIGN PATENT DOCUMENTS

| JP | S58197909 A | 11/1983 |
|---|---|---|
| JP | 2009260845 A | 11/2009 |

(Continued)

OTHER PUBLICATIONS

International Search Report issued for PCT/JP2018/030254, dated Oct. 30, 2018.

(Continued)

*Primary Examiner* — Jeffrey M Shin
(74) *Attorney, Agent, or Firm* — Arent Fox LLP

(57) ABSTRACT

A quartz crystal resonator unit includes a quartz crystal substrate, first and second excitation electrodes, first and second conductive sealing members, and first and second exterior members. The first excitation electrode is disposed on a first main surface of the substrate with the first conductive sealing member surrounding the first excitation electrode. Similarly, the second excitation electrode is disposed on a second main surface of the substrate with the second conductive sealing surrounding the second excitation electrode. The first and second exterior members are bonded to the quartz crystal substrate with the first and second conductive sealing member respectively interposed therebetween and to cover the first and excitation electrodes, respectively. In a plan view of the first main surface of the substrate, at least part of the first conductive sealing member is located outward of the second conductive sealing member.

17 Claims, 11 Drawing Sheets

(56) References Cited

FOREIGN PATENT DOCUMENTS

| JP | 2012060628 A | 3/2012 |
| JP | 2017085327 A | 5/2017 |
| WO | 2017126185 A1 | 7/2017 |

OTHER PUBLICATIONS

Written Opinion of the International Searching Authority issued for PCT/JP2018/030254, dated Oct. 30, 2018.

* cited by examiner

FIG. 4
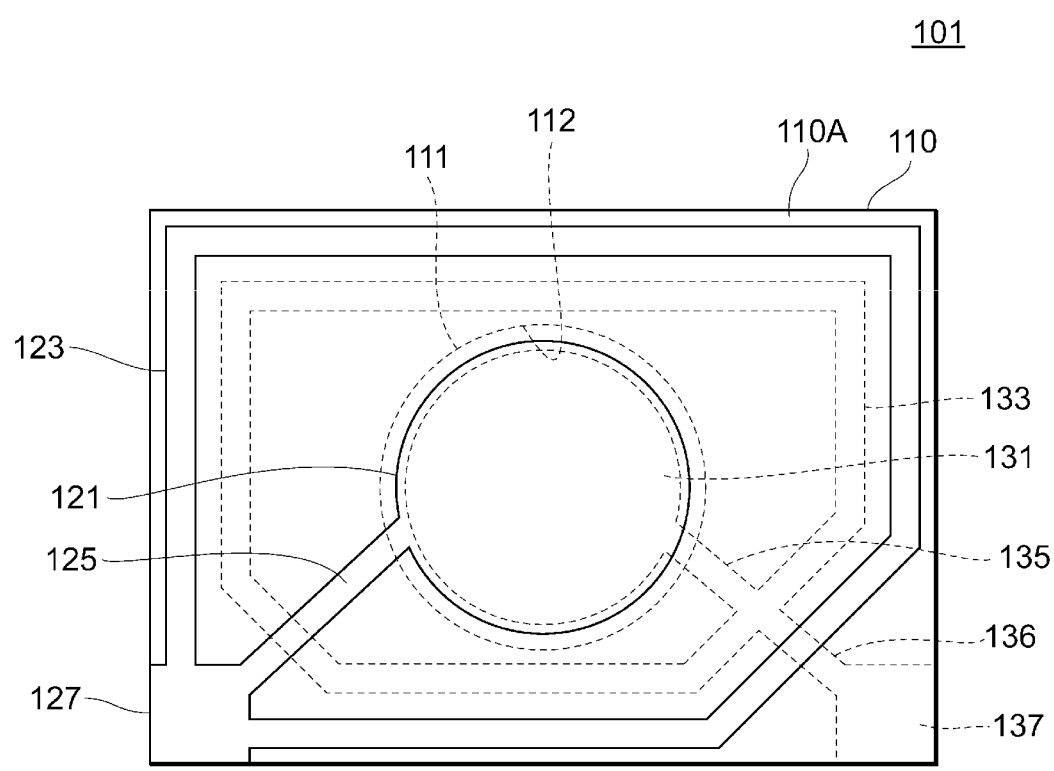
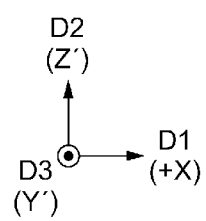

FIG. 6
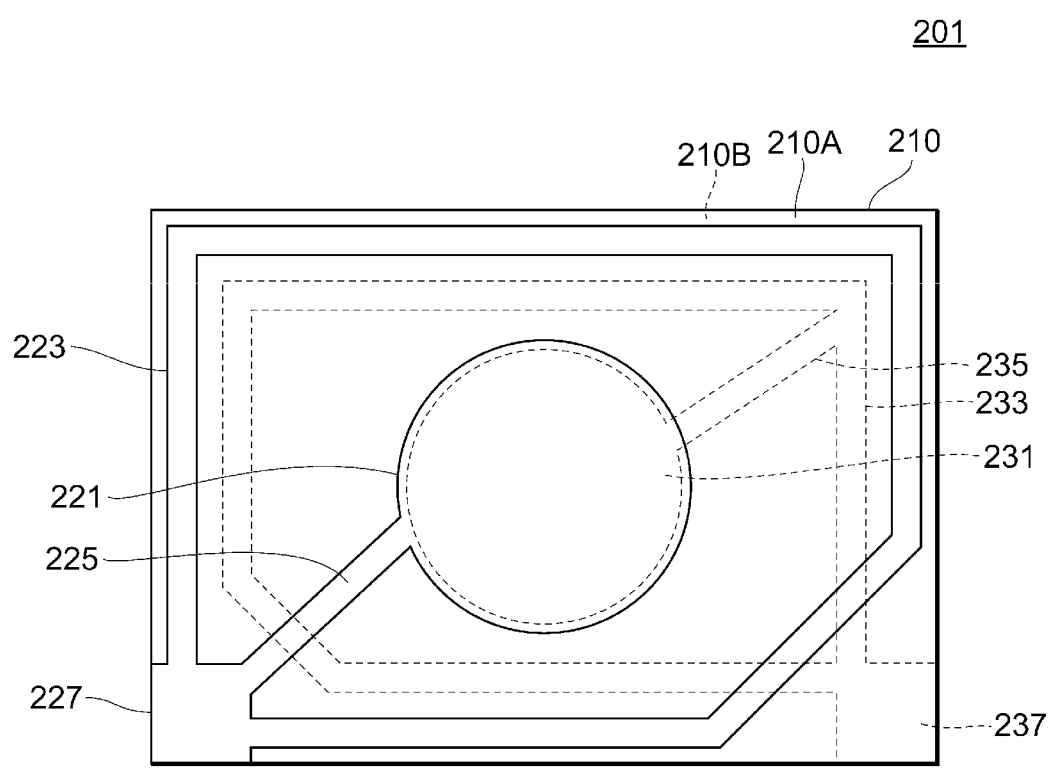
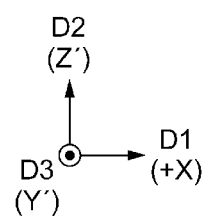

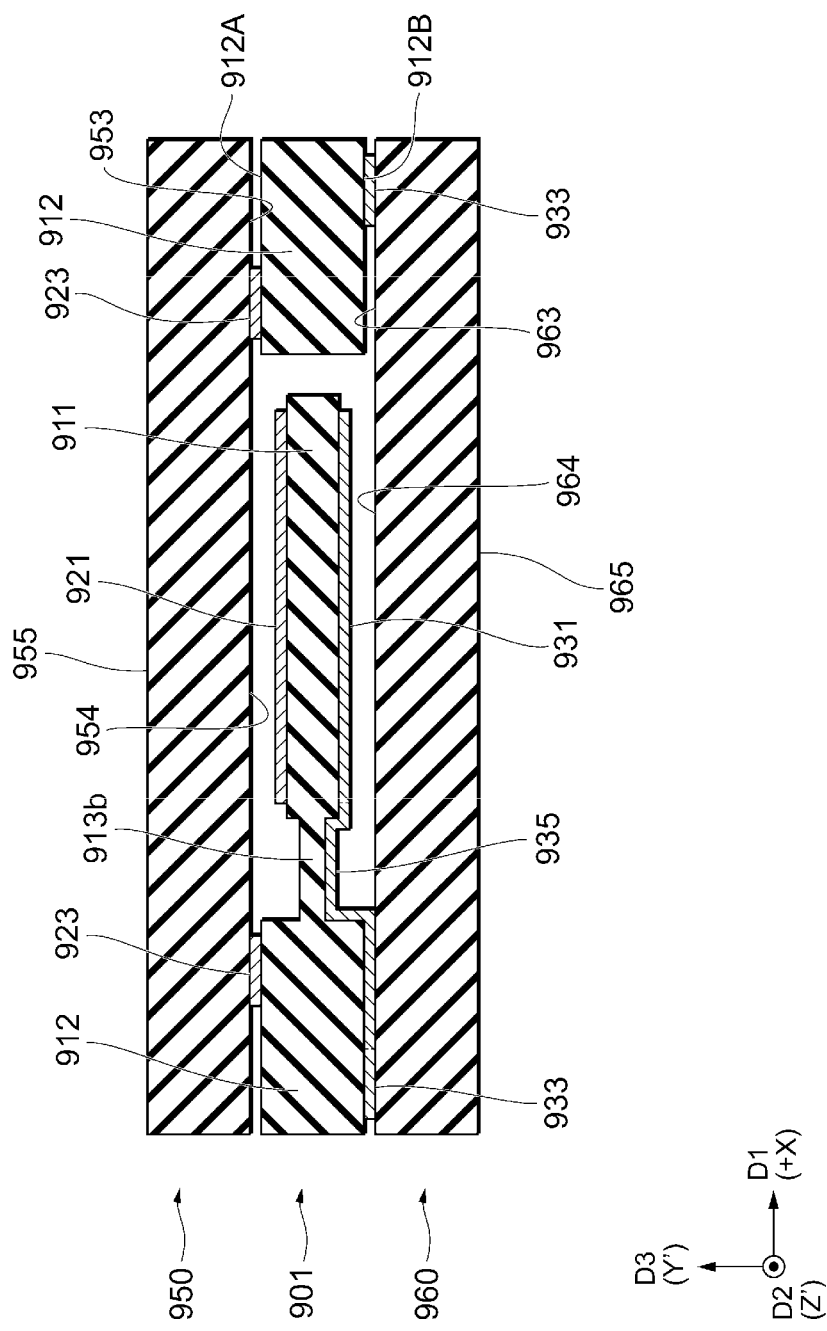

QUARTZ CRYSTAL RESONATOR UNIT

CROSS REFERENCE TO RELATED APPLICATIONS

The present application is a continuation of PCT/JP2018/030254 filed Aug. 14, 2018, which claims priority to Japanese Patent Application No. 2017-168783, filed Sep. 1, 2017, the entire contents of each of which are incorporated herein by reference.

TECHNICAL FIELD

The present invention relates to a quartz crystal resonator unit that may be used as a timing device and a load sensor, for example.

BACKGROUND

Currently, a piezoelectric resonator unit is installed in a mobile communication device, for example, and is used as a timing device and a load sensor, for example. A quartz crystal resonator unit, which is one type of piezoelectric resonator unit, uses a synthetic quartz crystal in a piezoelectric member and has a high frequency accuracy. As recent electronic devices are becoming smaller, it is also desirable to reduce the size of quartz crystal resonator units.

For example, Patent Document 1 (identified below) discloses a manufacturing method for a quartz crystal resonator unit that includes forming an electrode pad and a connecting electrode; bonding two exterior members to both surfaces of a quartz crystal substrate via sealing members formed on these surfaces; and forming an inner wiring conductor by connecting the electrode pad and the connecting electrode as a result of applying a laser beam from the outside of the exterior member to the electrode pad and the connecting electrode. The inner wiring conductor, which is constituted by the electrode pad and the connecting electrode integrated together, is electrically connected to a via-electrode passing through the exterior member. According to this manufacturing method, the wiring conductor can be reliably connected while decreasing the height of the quartz crystal resonator unit. A multilayer structure in which a quartz crystal substrate is sandwiched between two exterior members will be called the sandwich structure.

Patent Document 1: Japanese Unexamined Patent Application Publication No. 2009-260845.

If a through-hole for the via-electrode is formed in the quartz crystal substrate, a region for forming the through-hole is required, thereby making it difficult to reduce the size of the quartz crystal resonator unit. To address this issue, a quartz crystal resonator unit may be configured in the following manner. Specifically, an extended electrode and a conductive sealing member can be formed integrally, and a voltage is applied to an excitation electrode via the conductive sealing member. In such a quartz crystal resonator unit, the provision of a through-hole can be omitted, thereby reducing the size of the quartz crystal resonator unit. However, if the extended electrode and the conductive sealing member are formed integrally, a voltage is also applied to the conductive sealing member when being applied to the excitation electrode. Conductive sealing members opposing each other with the quartz crystal substrate therebetween may produce an unwanted resonance. Such an unwanted resonance transmits through the quartz crystal substrate, which degrades the resonance characteristics of the quartz crystal resonator unit.

SUMMARY OF THE INVENTION

The exemplary embodiments of the present invention have as been made in view of the above-described background. Accordingly, a quartz crystal resonator unit is provided with a reduced size and that also is less likely to degrade the resonance characteristics.

In one aspect, a quartz crystal resonator unit according to an exemplary aspect includes a quartz crystal substrate, first and second excitation electrodes, first and second conductive sealing members, and first and second exterior members. The quartz crystal substrate has first and second main surfaces opposing each other. The first excitation electrode is disposed on the first main surface of the quartz crystal substrate. The second excitation electrode is disposed on the second main surface of the quartz crystal substrate and opposes the first excitation electrode with the quartz crystal substrate interposed therebetween. Moreover, the first conductive sealing member is disposed on the first main surface of the quartz crystal substrate and surrounds the first excitation electrode. The second conductive sealing member is disposed on the second main surface of the quartz crystal substrate and surrounds the second excitation electrode. The first exterior member is bonded to the quartz crystal substrate with the first conductive sealing member interposed therebetween and covers the first excitation electrode with a space between the first exterior member and the first excitation electrode. The second exterior member is bonded to the quartz crystal substrate with the second conductive sealing member interposed therebetween and covers the second excitation electrode with a space between the second exterior member and the second excitation electrode. A first extended electrode is disposed on the first main surface of the quartz crystal substrate. The first extended electrode electrically connects the first excitation electrode and the first conductive sealing member with each other. A second extended electrode is disposed on the second main surface of the quartz crystal substrate. The second extended electrode electrically connects the second excitation electrode and the second conductive sealing member with each other. In a plan view of the first main surface of the quartz crystal substrate, at least part of the first conductive sealing member is located outward of the second conductive sealing member, and the first extended electrode intersects the second conductive sealing member with the quartz crystal substrate interposed therebetween.

According to the exemplary embodiments of the present invention, a quartz crystal resonator unit is provided with reduced size and that also is less likely to degrade the resonance characteristics.

BRIEF DESCRIPTION OF DRAWINGS

FIG. 4 is a plan view schematically illustrating the configuration of a quartz crystal substrate in the first exemplary embodiment.

FIG. 6 is a plan view schematically illustrating the configuration of a quartz crystal substrate in a second exemplary embodiment.

FIG. 11 is a sectional view schematically illustrating the configuration of the quartz crystal resonator unit according to the fifth exemplary embodiment.

DETAILED DESCRIPTION OF EMBODIMENTS

Figure 1:
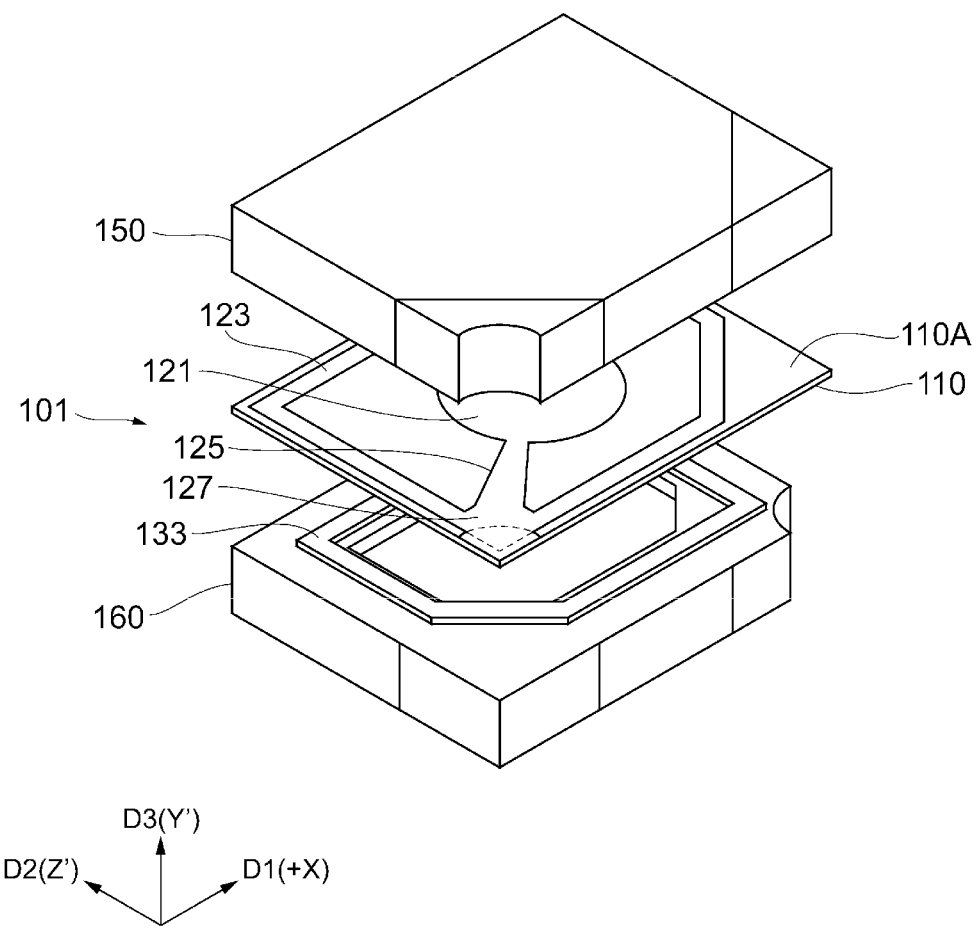
FIG. 1 is an exploded perspective view schematically illustrating the configuration of a quartz crystal resonator unit according to a first exemplary embodiment.

Exemplary embodiments of the present invention will be described below with reference to the accompanying drawings. In second through fifth embodiments, elements identical to or similar to those of a first embodiment will be designated by like reference numerals, and a detailed explanation thereof will be omitted. An explanation of advantages obtained by the second through fifth embodiments similar to those of the first embodiment will be omitted. Thus, it should be appreciated that the drawings representing the embodiments are only examples, and the dimensions and the configurations of the individual elements are illustrated merely schematically. The exemplary embodiments are not intended to be exhaustive or to limit the technical scope of the invention of this application.

First Exemplary Embodiment

Figure 2:
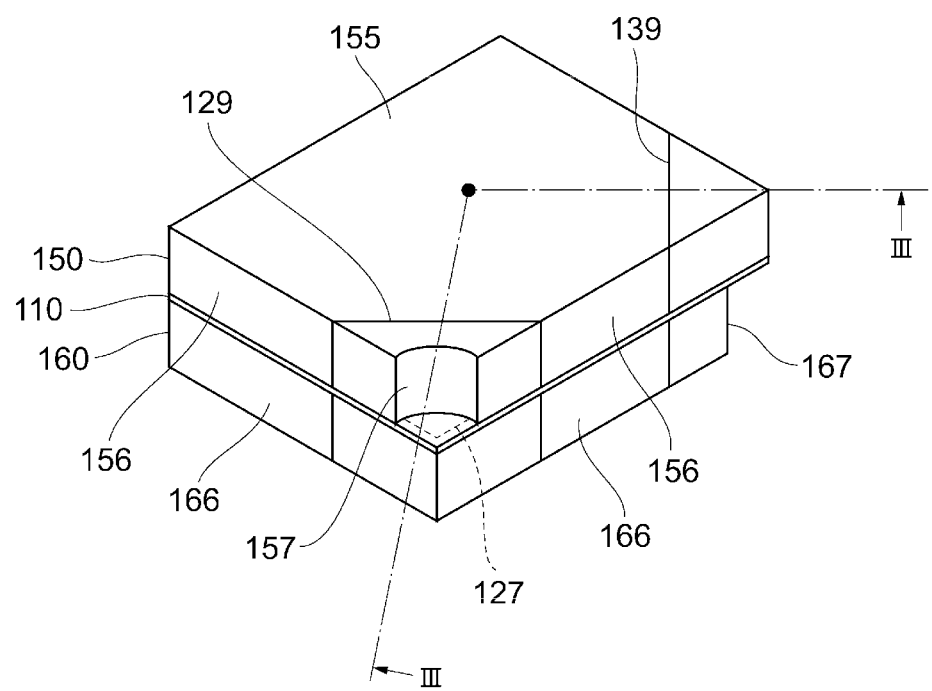
FIG. 2 is a perspective view schematically illustrating the configuration of the quartz crystal resonator unit shown in FIG. 1.
Figure 3:
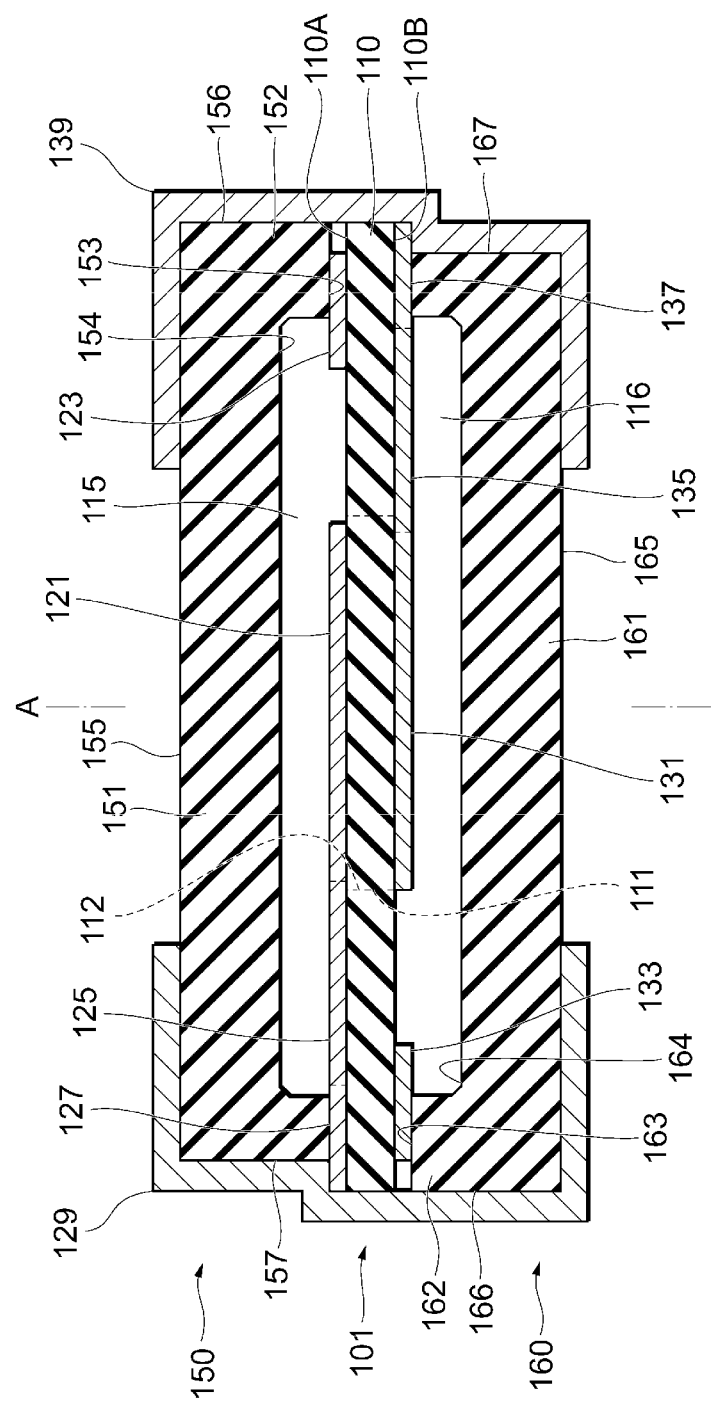
FIG. 3 is a sectional view schematically illustrating the configuration of the quartz crystal resonator unit taken along line III-III in FIG. 2.

First, the configuration of a quartz crystal resonator unit 100 according to a first embodiment of the invention will be described below with reference to FIGS. 1 through 4. FIG. 1 is an exploded perspective view schematically illustrating the configuration of the quartz crystal resonator unit according to the first embodiment. FIG. 2 is a perspective view schematically illustrating the configuration of the quartz crystal resonator unit shown in FIG. 1. FIG. 3 is a sectional view schematically illustrating the configuration of the quartz crystal resonator unit taken along line III-III in FIG. 2. FIG. 4 is a plan view schematically illustrating the configuration of a quartz crystal substrate in the first embodiment. For illustrative purposes, a first direction D1, a second direction D2, and a third direction D3 shown in the drawings are perpendicular to one another in an exemplary aspect. However, these directions may not necessarily cross at right angles and may intersect one another at an angle other than 90°.

The quartz crystal resonator unit 100 is one type of piezoelectric resonator unit, and excites a quartz crystal resonator 101 in accordance with an applied voltage. The quartz crystal resonator 101 uses a quartz crystal element as a piezoelectric member which resonates in response to an applied voltage.

The quartz crystal resonator unit 100 includes the quartz crystal resonator 101, a first exterior member 150, and a second exterior member 160, which can each be considered a lid or cover for the quartz crystal resonator 101. As such, the quartz crystal resonator unit 100 has a so-called sandwich structure in which the quartz crystal resonator 101 is sandwiched between the first and second exterior members 150 and 160.

The quartz crystal resonator 101 includes a planar quartz crystal substrate 110. The quartz crystal substrate 110 has a first main surface 110A and a second main surface 110B opposing each other. The first main surface 110A is located on the side opposing the first exterior member 150, while the second main surface 110B is located on the side opposing the second exterior member 160.

In an exemplary aspect, the quartz crystal substrate 110 is an AT-cut quartz crystal element, for example. The AT-cut quartz crystal element is a thin-film quartz crystal which is cut from a synthetic quartz crystal so that a plane parallel with a plane defined by the X axis and the Z' axis (hereinafter, such a plane will be called "the XZ' plane", and a plane defined by other axes will also be called in this manner) serves as the main surface. The X, Y, and Z axes are the crystal axes of a synthetic quartz crystal. The Y' axis is an axis formed by rotating the Y axis around the X axis in a direction from the Y axis to the Z axis by 35° 15'±1'30". Likewise, the Z' axis is an axis formed by rotating the Z axis around the X axis in a direction from the Y axis to the Z axis by 35° 15'±1'30". That is, in the quartz crystal substrate 110, which is an AT-cut quartz crystal element, the first and second main surfaces 110A and 110B each correspond to the XZ' plane. The cut angle of the quartz crystal element may be other than the AT-cut angle (the BT-cut angle, for example).

The AT-cut quartz crystal substrate 110 has a longitudinal direction in which a long side extends in the X-axis direction, a widthwise direction in which a short side extends in the Z'-axis direction, and a thickness direction in which a thickness side extends in the Y'-axis direction. Moreover, in the exemplary aspect, the quartz crystal substrate 110 has a rectangular shape in a plan view of the first main surface 110A, and includes an excitation portion 111 and a peripheral portion 112. The excitation portion 111 is located at the center and is excited to produce resonance. The peripheral portion 112 surrounds the excitation portion 111. The excitation portion 111 and the peripheral portion 112 are continuously provided. The quartz crystal substrate 110 is formed in a flat shape in which the excitation portion 111 and the peripheral portion 112 have substantially the same thickness. However, the quartz crystal substrate 110 is not limited to this configuration if it is formed in a planar shape. For example, the quartz crystal substrate 110 may have a mesa structure in which the excitation portion 111 is thicker than the peripheral portion 112. Conversely, the quartz crystal substrate 110 may have an inverted mesa structure in which the excitation portion 111 is thinner than the peripheral portion 112. Moreover, the quartz crystal substrate 110 may alternatively be formed in a convex shape or a bevel shape in which the thicknesses of the excitation portion 111 and the peripheral portion 112 are progressively changed. If the quartz crystal substrate 110 has a planar shape, the excitation portion 111 of the quartz crystal substrate 110 is easily deformed by an external load applied to the quartz crystal resonator unit 100. The quartz crystal resonator unit 100 sensitively responds to a load to change the resonance characteristics. Hence, the quartz crystal resonator unit 100 can be suitably used as a load sensor. In an exemplary embodiment, a slit may be formed between the excitation portion 111 and the peripheral portion 112, as will be discussed below.

In the example of the configuration shown in FIGS. 1 and 2, the quartz crystal substrate 110 is disposed so that the X axis is parallel with the first direction D1, the Z' axis is parallel with the second direction D2, and the Y' axis is parallel with the third direction D3.

In general, a quartz crystal resonator using an AT-cut quartz crystal element exhibits high-stability frequency characteristics over a wide temperature range and excellent temporal change characteristics, and can also be manufactured at low cost. This type of quartz crystal resonator can thus be suitably used as a timing device. The quartz crystal resonator is also sensitive to an external load, and the excitation frequency is changed in accordance with the deformation of the quartz crystal resonator. Hence, the quartz crystal resonator can also be suitably used as a load sensor. The AT-cut quartz crystal resonator uses the thickness shear mode as the main resonation mode.

The quartz crystal resonator 101 includes first and second excitation electrodes 121 and 131 (e.g., FIG. 3), which form a pair of electrodes. The first and second excitation electrodes 121 and 131 are located at positions corresponding to the position of the excitation portion 111. The first excitation electrode 121 is disposed on the first main surface 110A of the quartz crystal substrate 110, while the second excitation electrode 131 is disposed on the second main surface 110B of the quartz crystal substrate 110. The first and second excitation electrodes 121 and 131 oppose each other with the quartz crystal substrate 110 interposed therebetween. The first and second excitation electrodes 121 and 131 substantially entirely match each other in the XZ' plane. Moreover, the first and second excitation electrodes 121 and 131 are provided in a circular shape in a plan view of the first and second main surfaces 110A and 110B. However, it should be appreciated that they are not restricted to a circular shape, and may be formed in a polygon, an ellipse, or a combination thereof, such as a rectangle.

According to the exemplary embodiment, the quartz crystal resonator 101 includes first and second conductive sealing members 123 and 133 having conductivity. The first and second conductive sealing members 123 and 133 are disposed at positions corresponding to the position of the peripheral portion 112. The first conductive sealing member 123 is disposed on the first main surface 110A of the quartz crystal substrate 110. The first conductive sealing member 123 is formed in a frame-like shape to surround the first excitation electrode 121 in a plan view of the first main surface 110A. Similarly, the second conductive sealing member 133 is disposed on the second main surface 110B of the quartz crystal substrate 110. The second conductive sealing member 133 is formed in a frame-like shape to surround the second excitation electrode 131 in a plan view of the second main surface 110B.

Moreover, the quartz crystal resonator 101 further includes first and second extended electrodes 125 and 135. The first extended electrode 125 is disposed on the first main surface 110A of the quartz crystal substrate 110. The first extended electrode 125 electrically connects the first excitation electrode 121 and the first conductive sealing member 123. Similarly, the second extended electrode 135 is disposed on the second main surface 110B of the quartz crystal substrate 110. The second extended electrode 135 electrically connects the second excitation electrode 131 and the second conductive sealing member 133.

The quartz crystal resonator 101 also includes first and second connecting electrodes 127 and 137. The first and second connecting electrodes 127 and 137 are disposed at positions corresponding to the position of the peripheral portion 112 of the quartz crystal substrate 110. As further shown in FIG. 4, for example, the first connecting electrode 127 is disposed on the first main surface 110A of the quartz crystal substrate 110. The second connecting electrode 137 is disposed on the second main surface 110B of the quartz crystal substrate 110.

The first connecting electrode 127 is provided continuously from the first conductive sealing member 123. In other words, the first connecting electrode 127 forms part of the first conductive sealing member 123. The first extended electrode 125 is directly connected with the first connecting electrode 127. The second connecting electrode 137 is separately provided outward of the second conductive sealing member 133 and is electrically connected to the second conductive sealing member 133 via a third extended electrode 136. The third extended electrode 136 is disposed on the second main surface 110B of the quartz crystal substrate 110. That is, the first connecting electrode 127 is electrically connected to the first conductive sealing member 123, while the second connecting electrode 137 is electrically connected to the second conductive sealing member 133. It should be appreciated that the first and second connecting electrodes 127 and 137 are not limited to the above-described configuration if they are electrically connected to the first and second conductive sealing members 123 and 133, respectively. For example, the first connecting electrode 127 may be provided separately from the first conductive sealing member 123 and be electrically connected to the first conductive sealing member 123 via another extended electrode. Moreover, it is noted that the provision of the third extended electrode 136 may be omitted, and the second connecting electrode 137 may be continuously formed from the second conductive sealing member 133.

As described above, on the first main surface 110A of the quartz crystal substrate 110, an electrode group formed by the first excitation electrode 121, the first conductive sealing member 123, the first extended electrode 125, and the first connecting electrode 127 is provided. Similarly, on the second main surface 110B of the quartz crystal substrate 110, an electrode group formed by the second excitation electrode 131, the second conductive sealing member 133, the second extended electrode 135, and the second connecting electrode 137 is provided.

A description will be given of the positional relationship between the electrode group on the first main surface 110A and that on the second main surface 110B, in a plan view of the first main surface 110A of the quartz crystal substrate 110 in FIG. 4. The first and second conductive sealing members 123 and 133 are disposed separately from each other. The first and second extended electrodes 125 and 135 are disposed separately from each other. The first and second connecting electrodes 127 and 137 are disposed separately from each other.

In the example in FIG. 4, the first conductive sealing member 123 is disposed outward of the second conductive sealing member 133, that is, it is disposed in a direction in which it is separated from the excitation portion 111, so that it does not overlap the second conductive sealing member 133 in the thickness direction (i.e., the Y' axis direction). That is, the second conductive sealing member 133 surrounds the first and second excitation electrodes 121 and 131, and the first conductive sealing member 123 surrounds the second conductive sealing member 133. This configuration can regulate the excitation of the quartz crystal substrate 110 between the first and second conductive sealing members 123 and 133, thereby reducing the unwanted resonance to be added to the resonance generated in the excitation portion 111. In another mode of the example in FIG. 4, the first and second conductive sealing members 123 and 133 may partially overlap each other if they do not at least partially overlap each other. For example, part of the inner side of the first conductive sealing member 123 may overlap the second conductive sealing member 133, and part of the outer side of the first conductive sealing member 123 may not overlap the second conductive sealing member 133.

As further shown, the first and second connecting electrodes 127 and 137 are disposed at end portions of the quartz crystal substrate 110. More specifically, the first connecting electrode 127 is located at a corner formed by the short side on the negative side of the first direction D1 and the long side on the negative side of the second direction D2 of the quartz crystal substrate 110. The second connecting electrode 137 is located at the corner formed by the short side on the positive side of the first direction D1 and the long side on the negative side of the second direction D2 of the quartz crystal substrate 110. That is, the first and second connecting electrodes 127 and 137 are disposed on the same edge side of the quartz crystal substrate 110. This configuration can regulate the excitation of the quartz crystal substrate 110 between the first and second connecting electrodes 127 and 137, thereby reducing the unwanted resonance to be added to the resonance generated in the excitation portion 111. The positions of the first and second connecting electrodes 127 and 137 are not restricted to the above-described positions if they extend at end portions of the quartz crystal substrate 110. For example, the first and second connecting electrodes 127 and 137 may be located at diagonally positioned corners, or they may be located at the central portions of edge sides separate from the corners.

The second connecting electrode 137 is disposed outward of the first conductive sealing member 123 so that it does not overlap the first conductive sealing member 123 in the thickness direction. This configuration can regulate the excitation of the quartz crystal substrate 110 between the second connecting electrode 137 and the first conductive sealing member 123. The second connecting electrode 137 and the first conductive sealing member 123 may be disposed in any manner if they do not at least partially overlap each other. For example, the side of the second connecting electrode 137 closer to the excitation portion 111 may overlap the first conductive sealing member 123, and the other side of the second connecting electrode 137 may not overlap the first conductive sealing member 123. Likewise, the first connecting electrode 127 is disposed outward of the second conductive sealing member 133 so that it does not overlap the second conductive sealing member 133. The first connecting electrode 127 and the second conductive sealing member 133 may also be disposed in any manner if they do not at least partially overlap each other.

As yet further shown, the first extended electrode 125 extends in a direction in which the first excitation electrode 121 and the first connecting electrode 127 are connected with each other. The second extended electrode 135 extends in a direction in which the second excitation electrode 131 and the second connecting electrode 137 are connected with each other. That is, the first and second extended electrodes 125 and 135 extend in different directions as viewed from the excitation portion 111. Moreover, the third extended electrode 136 is aligned with the second extended electrode 135. This configuration can regulate the excitation of the quartz crystal substrate 110 between the first and second extended electrodes 125 and 135, thereby reducing the unwanted resonance to be added to the resonance generated in the excitation portion 111.

The first extended electrode 125 intersects the second conductive sealing member 133 (i.e., overlapping in the thickness direction) at one point with the quartz crystal substrate 110 interposed therebetween. The third extended electrode 136 intersects the first conductive sealing member 123 (i.e., overlapping in the thickness direction) at one point with the quartz crystal substrate 110 interposed therebetween. This configuration can reduce the area by which the electrode group on the first main surface 110A and that on the second main surface 110B oppose each other. That is, this can regulate the excitation which causes the unwanted resonance at the peripheral portion 112, thereby reducing the unwanted resonance to be added to the resonance generated in the excitation portion 111. In an exemplar aspect, the first extended electrode 125 and the second conductive sealing member 133 are substantially perpendicular to each other. Moreover, the third extended electrode 136 and the first conductive sealing member 123 are substantially perpendicular to each other. This configuration can further reduce the area by which the electrode group on the first main surface 110A and that on the second main surface 110B oppose each other.

The electrode group formed on the first main surface 110A of the quartz crystal substrate 110 is integrally formed by the same material. The electrode group formed on the second main surface 110B of the quartz crystal substrate 110 is also integrally formed by the same material. The materials for the individual electrode groups are not restricted to particular materials. For example, as an underlying layer, a chromium (Cr) layer is disposed on the side of the electrode group which contacts the quartz crystal substrate 110, and as a front layer, a gold (Au) layer is disposed on the side of the electrode group which is separated from the quartz crystal substrate 110. As a result of disposing a metal layer having a high reactivity with oxygen as the underlying layer, the adhesion between the quartz crystal substrate 110 and the electrode group is enhanced. As a result of disposing a metal layer having a low reactivity with oxygen as the front layer, the degradation of the excitation electrodes is reduced, thereby enhancing the electrical reliability.

The first exterior member 150 corresponds to one of a pair of retainers for storing the excitation portion 111 of the quartz crystal substrate 110 therein. The first exterior member 150, which is formed in a recessed shape, is formed in a box-like shape opened toward the first main surface 110A of the quartz crystal substrate 110. The first exterior member 150 is bonded to the quartz crystal substrate 110 with the first conductive sealing member 123 interposed therebetween so as to cover the first excitation electrode 121 with an internal space 115 formed between the first exterior member 150 and the first excitation electrode 121. It should be appreciated that the first exterior member 150 is not limited to a particular shape if it does not interfere with the excitation of the excitation portion 111. The first exterior member 150 may be a planar shape having a planar main surface opposing the quartz crystal substrate 110 or a tubular shape to store the quartz crystal substrate 110 therein.

As shown in FIG. 3, the first exterior member 150 has a top wall portion 151 and a side wall portion 152. The top wall portion 151 opposes the first main surface 110A of the quartz crystal substrate 110. The side wall portion 152 is connected to the outer edge of the top wall portion 151 and extends in a direction in which it intersects the main surface of the top wall portion 151.

The first exterior member 150 has an opposing surface 153, an inner surface 154, an outer main surface 155, and outer side surfaces 156. The opposing surface 153 is a surface which opposes, at the end edge of the side wall portion 152, the first main surface 110A of the quartz crystal substrate 110 corresponding to the position of the peripheral portion 112. In a plan view of the first main surface 110A of the quartz crystal substrate 110, the opposing surface 153 extends in a frame-like shape to surround the first excitation electrode 121. The inner surface 154 is located on the side of the top wall portion 151 and that of the side wall portion 152 facing the inner space 115. Moreover, the inner surface 154 is a surface defined by the inner main surface which overlaps the first main surface 110A and the inner side surface which surrounds the first excitation electrode 121 in a plan view of the first main surface 110A of the quartz crystal substrate 110. The outer main surface 155 is located on the side of the top wall portion 151 opposite the inner space 115. The outer main surface 155 is a surface which overlaps the first main surface 110A of the quartz crystal substrate 110 in a plan view of the first main surface 110A. The outer side surfaces 156 are located on the sides of the side wall portion 152 opposite the inner space 115. The outer side surfaces 156 are surfaces linking the opposing surface 153 and the outer main surface 155.

As shown in FIG. 2, a first terminal portion 157 is formed in the first exterior member 150. The first terminal portion 157 is a structure for exposing at least part of the first connecting electrode 127. In a plan view of the outer main surface 155 of the first exterior member 150, the first terminal portion 157 is a hollow formed at a corner of the first exterior member 150 and is connected with the outer side surfaces 156. That is, the first terminal portion 157 exposes at least part of the first connecting electrode 127 to protrude from the end portion of the first exterior member 150. The first terminal portion 157 is formed from the opposing surface 153 to the outer main surface 155 in the third direction D3.

The second exterior member 160 corresponds to the other one of the pair of retainers for storing the excitation portion 111 of the quartz crystal substrate 110 therein. The second exterior member 160, which is formed in a recessed shape, as in the first exterior member 150, is formed in a box-like shape opened toward the second main surface 110B of the quartz crystal substrate 110. The second exterior member 160 is bonded to the quartz crystal substrate 110 with the second conductive sealing member 133 interposed therebetween so as to cover the second excitation electrode 131 with an internal space 116 formed between the second exterior member 160 and the second excitation electrode 131. The structure of the second exterior member 160 is similar to that of the first exterior member 150, and a detailed explanation thereof will be omitted.

As shown in FIG. 3, for example, the second exterior member 160 has a top wall portion 161 and a side wall portion 162. The top wall portion 161 opposes the second main surface 110B of the quartz crystal substrate 110. The side wall portion 162 is connected to the outer edge of the top wall portion 161 and extends in a direction in which it intersects the main surface of the top wall portion 161. The second exterior member 160 has an opposing surface 163, an inner surface 164, an outer main surface 165, and outer side surfaces 166. The opposing surface 163 is a surface which opposes the second main surface 110B of the quartz crystal substrate 110 corresponding to the position of the peripheral portion 112. The inner surface 164 is located on the side of the top wall portion 151 and that of the side wall portion 162 facing the inner space 116. The outer main surface 165 is located on the side of the top wall portion 161 opposite the inner space 116. The outer side surfaces 166 are surfaces linking the opposing surface 163 and the outer main surface 165.

In a manner similar to the first exterior member 150, a second terminal portion 167 is formed in the second exterior member 160. The second terminal portion 167 is a structure for exposing at least part of the second connecting electrode 137. In a plan view of the outer main surface 155 of the first exterior member 150, the first terminal portion 157 is a hollow formed at a corner of the second exterior member 160 and is connected with the outer side surfaces 166. The second terminal portion 167 is formed from the opposing surface 163 to the outer main surface 165 in the third direction D3.

In an exemplary aspect, the first and second exterior members 150 and 160 are made of the same material as the quartz crystal substrate 110, that is, they are made of a synthetic quartz crystal. This configuration can reduce the occurrence of distortion caused by the difference in the coefficient of thermal expansion between the first and second exterior members 150 and 160 and the quartz crystal substrate 110. Moreover, One of the first and second exterior members 150 and 160 can be made of a synthetic quartz crystal, and the other one of the first and second exterior members 150 and 160 can be made of another material. This design can reduce the occurrence of distortion at least caused by the difference in the coefficient of thermal expansion between one of the exterior members and the quartz crystal substrate 110. It should be appreciated that the material for the first and second exterior members 150 and 160 is not limited to a quartz crystal. For example, the first and second exterior members 150 and 160 may be made of a ceramic material. In this case, they may desirably be made of a ceramic material having a coefficient of thermal expansion close to a quartz crystal.

In a plan view of the first main surface 110A of the quartz crystal substrate 110, the first and second terminal portions 157 and 167 are formed on the same side of the quartz crystal substrate 110 such that they overlap different corners of the quartz crystal substrate 110. That is, the first and second terminal portions 157 and 167 are arranged on the long side of the quartz crystal substrate 110 on the negative side of the second direction D2. Moreover, the corners at which the first and second terminal portions 157 and 167 are formed are not limited to those on the negative side of the second direction D2. The first and second terminal portions 157 and 167 may be formed at corners on the positive side of the second direction D2, on the positive side of the first direction D1, or on the negative side of the first direction D1. The first and second terminal portions 157 and 167 may alternatively be formed to overlap diagonally positioned corners of the quartz crystal substrate 110 or be formed at the central portions on edge sides separate from the corners.

In addition, the first and second terminal portions 157 and 167 may be formed at positions other than the corners if they expose the first and second connecting electrodes 127 and 137, respectively. If the first connecting electrode 127 is disposed at the central portion on an edge side (e.g., a long side or a short side of the rectangular quartz crystal substrate 110) separate from the corners of the quartz crystal substrate 110, the first terminal portion 157 may be formed at the central portion of an edge side of the first exterior member 150 in a plan view of the outer main surface 155 of the first exterior member 150. If the second connecting electrode 137 is disposed at the central portion on an edge side separate from the corners of the quartz crystal substrate 110, the second terminal portion 167 may be formed at the central portion of an edge side of the second exterior member 160 in a plan view of the outer main surface 165 of the second exterior member 160. The first terminal portion 157 may be a hollow formed on the opposing surface 153 and separate from the outer main surface 155. The second terminal portion 167 may be a hollow formed on the opposing surface 163 and separate from the outer main surface 165. The first terminal portion 157 may be a through-hole passing through the side wall portion 152 of the first exterior member 150. The second terminal portion 167 may be a through-hole passing through the side wall portion 162 of the second exterior member 160.

According to the exemplary embodiment, the opposing surface 153 of the first exterior member 150 is bonded to the first main surface 110A of the quartz crystal substrate 110 corresponding to the position of the peripheral portion 112, with the first conductive sealing member 123 interposed therebetween. With this configuration, the first exterior member 150 seals the first excitation electrode 121 within the inner space 115 so that the excitation portion 111 of the quartz crystal substrate 110 can be excited. Similarly, the opposing surface 163 of the second exterior member 160 is bonded to the second main surface 110B of the quartz crystal substrate 110 corresponding to the position of the peripheral portion 112, with the second conductive sealing member 133 interposed therebetween. With this configuration, the second exterior member 160 seals the second excitation electrode 131 within the inner space 116 so that the excitation portion 111 of the quartz crystal substrate 110 can be excited. In addition to the first conductive sealing member 123, at least one more member may be disposed between the opposing surface 153 of the first exterior member 150 and the first main surface 110A of the quartz crystal substrate 110. For example, a metallized layer for enhancing the adhesion with a metal may be formed on the opposing surface 153 of the first exterior member 150. A brazing material made of a eutectic gold-tin (Au—Sn) alloy may be provided on the first conductive sealing member 123. A metallized layer and/or a brazing material may also be provided between the opposing surface 163 of the second exterior member 160 and the second main surface 110B of the quartz crystal substrate 110.

The inner spaces 115 and 116 are desirably in a vacuum state in which the air pressure is lower than the atmospheric pressure. This makes it less likely to oxidize the first and second excitation electrodes 121 and 131, and the weight of the quartz crystal resonator unit 100 is not changed, thereby reducing a temporal change in the resonance characteristics of the quartz crystal resonator unit 100. Additionally, the first and second extended electrodes 125 and 135 are less likely to oxidize, and the conductivity of the quartz crystal resonator unit 100 is not decreased, thereby reducing operation faults of the quartz crystal resonator unit 100. A residual gas within the inner spaces 115 and 116 is air containing oxygen ($O_2$), for example, which may be replaced by an inactive gas having a low reactivity with a metal or a reducing gas having a high reactivity with oxygen, for example. This can reduce oxidation of the various electrodes.

It is noted that the shape of the first exterior member 150 is not restricted to the above-described recessed shape if the inner space 115 can be formed between the first exterior member 150 and the first excitation electrode 121. Likewise, the shape of the second exterior member 160 is not restricted to the above-described recessed shape if the inner space 116 can be formed between the second exterior member 160 and the second excitation electrode 131. For example, if the peripheral portion 112 is thicker than the excitation portion 111 in the quartz crystal substrate 110, at least one of the first and second exterior members 150 and 160 may be formed in a flat shape.

In the quartz crystal resonator unit 100, first and second outer electrodes 129 and 139 are formed that are electrically connected to the first and second excitation electrodes 121 and 131, respectively. The first outer electrode 129 covers part of the outer main surface 155 and part of the outer side surfaces 156 of the first exterior member 150 so as to cover the first terminal portion 157. The first outer electrode 129 also covers part of the outer main surface 165 and part of the outer side surfaces 166 of the second exterior member 160. The second outer electrode 139 covers part of the outer main surface 165 and part of the outer side surfaces 166 of the second exterior member 160 so as to cover the second terminal portion 167. The second outer electrode 139 also covers part of the outer main surface 155 and part of the outer side surfaces 156 of the first exterior member 150. This configuration can electrically connect the first outer electrode 129 to the first connecting electrode 127 at an end portion of the quartz crystal resonator 101 without providing a via-hole in the first exterior member 150. Similarly, this configuration can also electrically connect the second outer electrode 139 to the second connecting electrode 137 at an end portion of the quartz crystal resonator 101 without providing a via-hole in the second exterior member 160. It is thus less likely that the air tightness within the inner spaces 115 and 116 is decreased and that the mechanical strength of the first and second exterior members 150 and 160 is reduced.

The first outer electrode 129 covers the exposed portion of the first connecting electrode 127, which is exposed by the first terminal portion 157 and protrudes from the first exterior member 150. The second outer electrode 139 covers the exposed portion of the second connecting electrode 137, which is exposed by the second terminal portion 167 and protrudes from the second exterior member 160. This configuration can increase the contact area between the first outer electrode 129 and the first connecting electrode 127, thereby stabilizing the electrical connection therebetween. Moreover, this configuration can increase the contact area between the second outer electrode 139 and the second connecting electrode 137, thereby stabilizing the electrical connection therebetween.

The first and second outer electrodes 129 and 139 are disposed to partially overlap the first and second connecting electrodes 127 and 137, respectively, and are thus located at the corners of the quartz crystal substrate 110 in a plan view of the first main surface 110A of the quartz crystal substrate 110. With this configuration, the distance between the first outer electrode 129 and the first excitation electrode 121 can be made longer than that in the configuration in which the first connecting electrode 127 and the first outer electrode 129 are disposed at the central portion of an edge side of the quartz crystal substrate 110. It is thus possible to reduce a leakage of the resonance transmitted through the first extended electrode 125 from the excitation portion 111. Similarly, it is possible to reduce a leakage of the resonance transmitted through the second extended electrode 135 from the excitation portion 111.

In the exemplary embodiment, the first and second outer electrodes 129 and 139 are arranged at the end portions on the same side of the quartz crystal substrate 110, and more specifically, at the end portions of the long side on the negative side of the second direction D2. With this configuration, the quartz crystal resonator unit 100 can be placed vertically in a state in which, while causing the side of the quartz crystal resonator unit 100 on which the first and second outer electrodes 129 and 139 are disposed to face an external substrate, the first and second main surfaces 110A and 110B of the quartz crystal substrate 110 vertically stand on the external substrate. However, it is noted that the first and second outer electrodes 129 and 139 may be disposed at any position if they are electrically connected to the first and second connecting electrodes 127 and 137, respectively. They may be located at diagonally positioned corners of the quartz crystal substrate 110 or at the central portions of edge sides separate from the corners.

In the quartz crystal resonator unit 100, an alternating voltage is applied to between the first and second excitation electrodes 121 and 131 via the first and second outer electrodes 129 and 139. This causes the excitation portion 111 of the quartz crystal substrate 110 to resonate in a predetermined resonance mode, such as the thickness shear mode, and the resonance characteristics based on the resonance mode are exhibited. By utilizing the resonance characteristics, the quartz crystal resonator unit 100 can be used as a timing device which resonates at a predetermined frequency. When a load is applied in a direction along the first main surface 110A of the quartz crystal substrate 110, the excitation portion 111 is deformed so as to change the resonance characteristics of the quartz crystal resonator unit 100. By utilizing this change in the resonance characteristics, the quartz crystal resonator unit 100 can be used as a load sensor for measuring a load.

Figure 5:
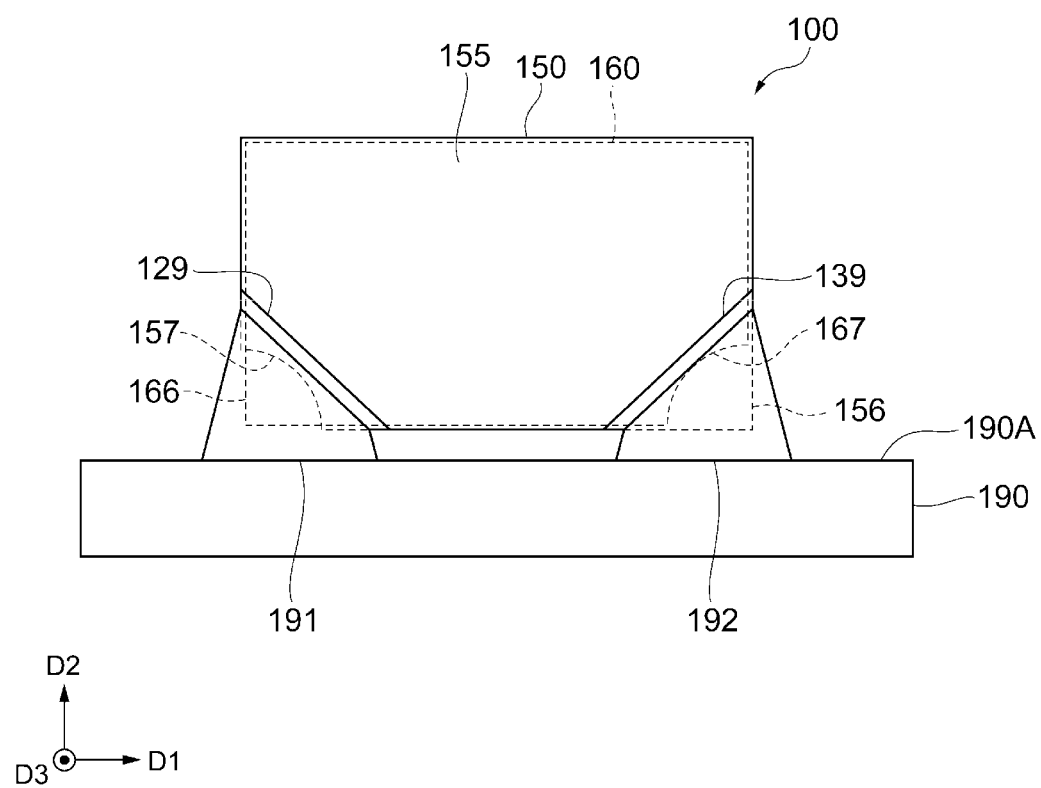
FIG. 5 is a schematic view illustrating an example of a mode in which the quartz crystal resonator unit according to the first exemplary embodiment is mounted on an external substrate.

An example of a mounting mode of the quartz crystal resonator unit 100 will be discussed below with reference to FIG. 5. FIG. 5 is a schematic view illustrating an example of a mode in which the quartz crystal resonator unit according to the first embodiment is mounted on an external substrate.

As shown, the quartz crystal resonator unit 100 is mounted on an external substrate 190 by using solder 191 and solder 192. The solder 191 electrically connects the first outer electrode 129 and the external substrate 190, while the solder 192 electrically connects the second outer electrode 139 and the external substrate 190. In the quartz crystal resonator unit 100, the first and second terminal portions 157 and 167 and the outer side surfaces 156 and 166 oppose the external substrate 190, and the outer main surface 155 of the first exterior member 150 extends in a direction substantially perpendicularly to a mounting surface 190A of the external substrate 190. That is, the quartz crystal resonator unit 100 is mounted vertically on the external substrate 190 in a state in which the quartz crystal substrate 110 vertically stands on the external substrate 190. This can reduce the mounting area of the quartz crystal resonator unit 100. Additionally, the deformation of the excitation portion 111 based on a load applied in a direction normal to the mounting surface 190A of the external substrate 190 becomes greater than when the quartz crystal resonator unit 110 is horizontally mounted on the external substrate 190 in a state in which the quartz crystal substrate 110 lies on the external substrate 190. That is, the resonance characteristics of the vertically mounted quartz crystal resonator unit 100 are changed by a greater amount in response to a load. The quartz crystal resonator unit 100 can thus be suitably used as a load sensor for detecting a load applied in a direction normal to the mounting surface 190A of the external substrate 190.

The solder 191 and the solder 192 respectively spread out along the first and second terminal portions 157 and 167. In other words, the solder 191 and the solder 192 respectively penetrate into the hollows of the first and second exterior members 150 and 160. This configuration can stabilize the mounting position of the quartz crystal resonator unit 100 and enhance the bonding strength of the quartz crystal resonator unit 100 to the external substrate 190.

Additional exemplary embodiments will be described below. The following embodiments will be described only by referring to points different from the first embodiment while omitting an explanation of the same points as the first embodiment. It is assumed that elements designated by like reference numerals of the first embodiment have configurations and functions similar to those of the counterparts of the first embodiment, and a detailed explanation thereof will be omitted. An explanation of similar advantages obtained by similar configurations will not be repeated.

Second Exemplary Embodiment

The configuration of a quartz crystal resonator of a quartz crystal resonator unit according to a second exemplary embodiment will be described below with reference to FIG. 6. FIG. 6 is a plan view schematically illustrating the configuration of a quartz crystal substrate in the second embodiment. It is assumed that first and second exterior members of the quartz crystal resonator unit according to the second embodiment are similar to those of the first embodiment, and they will not be explained nor will they be shown.

On a first main surface 210A of a quartz crystal substrate 210, a first excitation electrode 221, a first conductive sealing member 223, a first extended electrode 225, and a first connecting electrode 227 are disposed. On a second main surface 210B of the quartz crystal substrate 210, a second excitation electrode 231, a second conductive sealing member 233, a second extended electrode 235, and a second connecting electrode 237 are disposed.

As shown, the quartz crystal resonator 201 according to the second embodiment is different from the quartz crystal resonator 101 according to the first embodiment in that the first and second conductive sealing members 223 and 233 intersect each other (i.e., overlap each other in the thickness direction, i.e., the Y' axis direction).

As further shown, the second extended electrode 235 extends from the second excitation electrode 231 toward a corner diagonal to the corner toward which the first extended electrode 225 extends, and electrically connects the second excitation electrode 231 and the second conductive sealing member 233 with each other. The second extended electrode 235 does not overlap the first conductive sealing member 223. The extending direction of the second extended electrode 235 is not limited to the above-described direction. For example, the second extended electrode 235 may extend toward a corner diagonal to the corner at which the second connecting electrode 237 is disposed, or may extend toward the central portion of an edge side separate from the corners. Moreover, the second extended electrode 235 may extend toward the corner at which the second connecting electrode 237 is disposed and intersect the first conductive sealing member 223 with the quartz crystal substrate 210 interposed therebetween.

According to the exemplary aspect, the second connecting electrode 237 is continuously provided with the second conductive sealing member 233 and forms part of the second conductive sealing member 233. At the corner at which the second connecting electrode 237 is disposed, the second conductive sealing member 233 intersects the first conductive sealing member 223 at two points with the quartz crystal substrate 210 interposed therebetween.

In the second embodiment, the area by which the electrode group on the first main surface 210A and that on the second main surface 210B of the quartz crystal substrate 210 oppose each other becomes larger than that in the first embodiment. In the second embodiment, nevertheless, the area by which the electrode groups oppose each other is still smaller than the configuration in which conductive sealing members oppose each other all around a quartz crystal substrate, for example. It is noted that advantages similar to those of the first embodiment can thus be obtained.

Third Exemplary Embodiment

Figure 7:
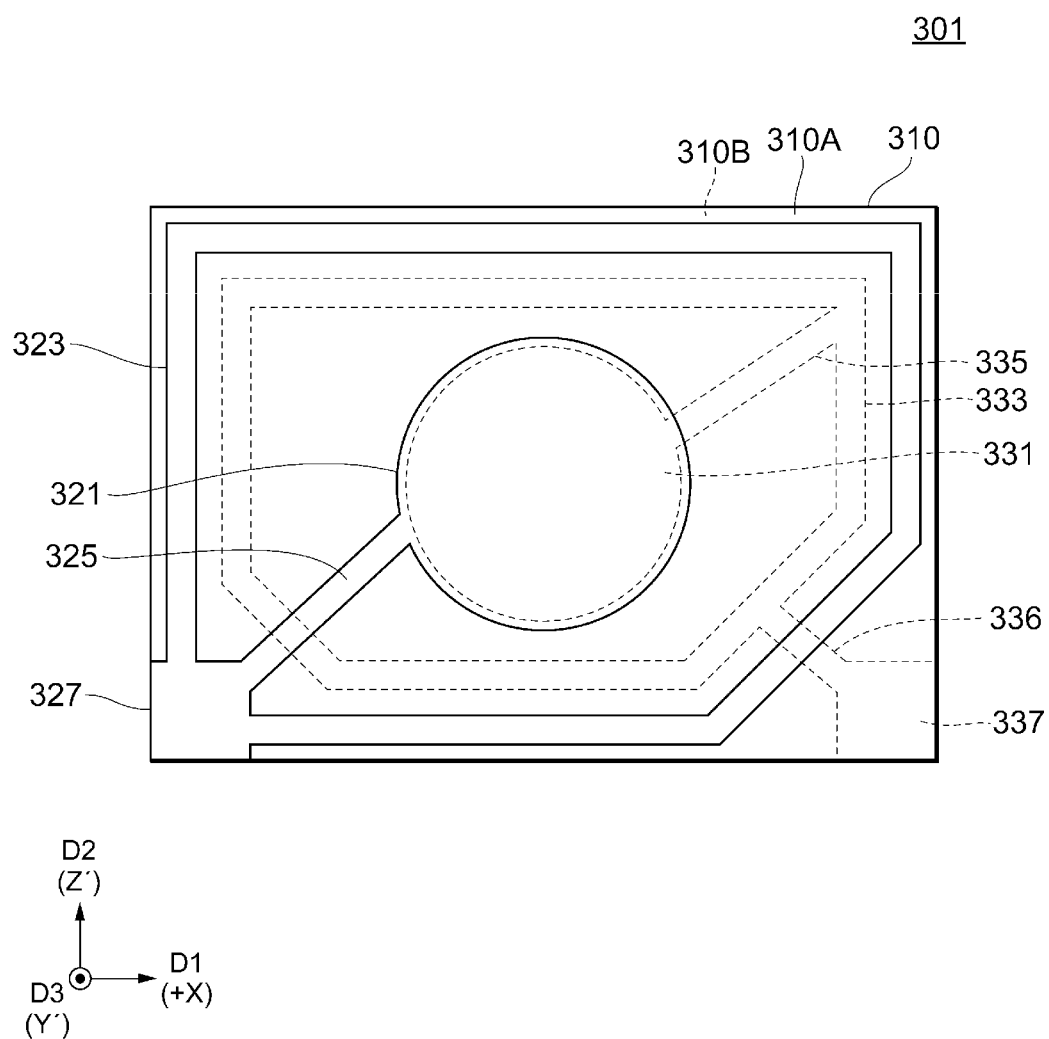
FIG. 7 is a plan view schematically illustrating the configuration of a quartz crystal substrate in a third exemplary embodiment.

The configuration of a quartz crystal resonator of a quartz crystal resonator unit according to a third embodiment will be described below with reference to FIG. 7. FIG. 7 is a plan view schematically illustrating the configuration of a quartz crystal substrate in the third embodiment. As in the second embodiment, first and second exterior members will not be explained nor will they be shown.

On a first main surface 310A of a quartz crystal substrate 310, a first excitation electrode 321, a first conductive sealing member 323, a first extended electrode 325, and a first connecting electrode 327 are disposed. On a second main surface 310B of the quartz crystal substrate 310, a second excitation electrode 331, a second conductive sealing member 333, a second extended electrode 335, and a second connecting electrode 337 are disposed.

According to the exemplary embodiment, the quartz crystal resonator 301 according to the third embodiment is different from the quartz crystal resonator 101 according to the first embodiment in that the second extended electrode 335 and a third extended electrode 336 extend in different directions as shown in FIG. 7.

Specifically, the second extended electrode 335 extends from the second excitation electrode 331 toward a corner diagonal to the corner toward which the first extended electrode 325 extends, and electrically connects the second excitation electrode 331 and the second conductive sealing member 333 with each other. That is, the connecting portion between the third extended electrode 336 and the second conductive sealing member 333 is separated from that between the second extended electrode 335 and the second conductive sealing member 333. It is noted that the extending direction of the second extended electrode 335 is not limited to the above-described direction if the connecting portion between the second extended electrode 335 and the second conductive sealing member 333 is separated from that between the third extended electrode 336 and the second conductive sealing member 333. For example, the second extended electrode 335 may extend toward a corner diagonal to the corner at which the second connecting electrode 337 is disposed or may extend toward the central portion of an edge side separate from the corners.

In the third embodiment configured as described above, advantages similar to those of the first embodiment can be obtained. The electrode group disposed on the second main surface 310B of the quartz crystal substrate 310 may become a transmission path for the resonance generated between the first and second excitation electrodes 321 and 331. Increasing the transmission path can reduce a leakage of the resonance to the outside.

Fourth Exemplary Embodiment

Figure 8:
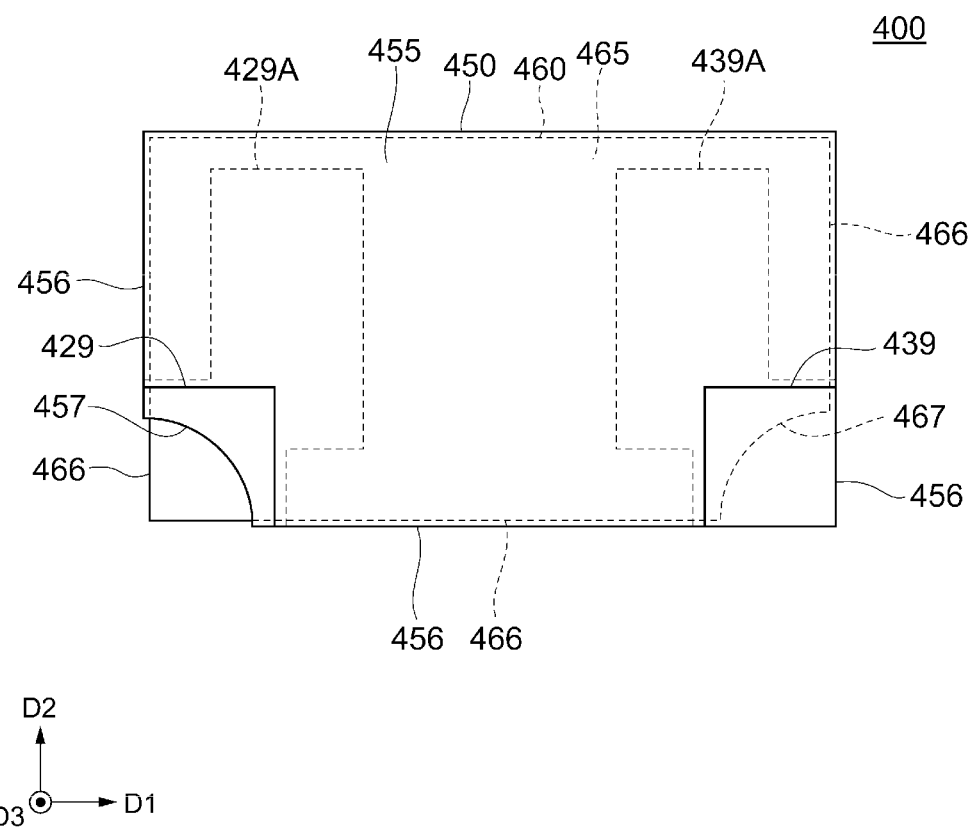
FIG. 8 is a plan view schematically illustrating the configuration of a quartz crystal resonator unit according to a fourth exemplary embodiment.
Figure 9:
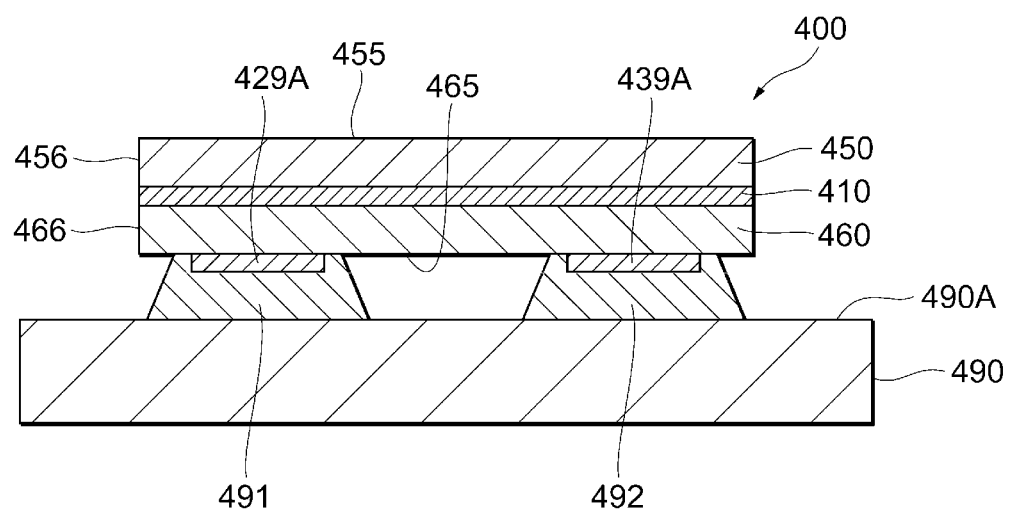
FIG. 9 is a schematic view illustrating an example of a mode in which the quartz crystal resonator unit according to the fourth exemplary embodiment is mounted on an external substrate.

The configuration of a quartz crystal resonator unit 400 according to a fourth embodiment and a mounting mode of the quartz crystal resonator unit 400 on an external substrate 490 will be described below with reference to FIGS. 8 and 9. FIG. 8 is a plan view schematically illustrating the configuration of the quartz crystal resonator unit according to the fourth embodiment. FIG. 9 is a schematic view illustrating an example of a mode in which the quartz crystal resonator unit according to the fourth embodiment is mounted on an external substrate. A quartz crystal resonator may be configured similarly to that shown in another embodiment, and will not be explained nor will it be shown.

As shown, the quartz crystal resonator unit 400 includes a quartz crystal substrate 410, first and second exterior members 450 and 460, and first and second outer electrodes 429 and 439. At one corner of the quartz crystal resonator unit 400, the first outer electrode 429 is disposed on an outer main surface 455, outer side surfaces 456, and a first terminal portion 457 of the first exterior member 450 and is also disposed on an outer main surface 465 and outer side surfaces 466 of the second exterior member 460. At another corner of the quartz crystal resonator unit 400, the second outer electrode 439 is disposed on the outer main surface 455 and the outer side surfaces 456 of the first exterior member 450 and is also disposed on the outer main surface 465, the outer side surfaces 466, and a second terminal portion 467 of the second exterior member 460.

The quartz crystal resonator unit 400 according to the fourth embodiment is different from the quartz crystal resonator unit 100 according to the first embodiment in that the first outer electrode 429 includes a bonding portion 429A extending on the outer main surface 465 of the second exterior member 460 and that the second outer electrode 439 includes a bonding portion 439A extending on the outer main surface 465 of the second exterior member 460.

The bonding portion 429A of the first outer electrode 429 extends at the central portion of the outer main surface 465 of the second exterior member 460. The bonding portion 439A of the second outer electrode 439 extends at the central portion of the outer main surface 465 of the second exterior member 460. The bonding portions 429A and 439A are arranged in the first direction D1 with a gap therebetween.

As shown in FIG. 9, the quartz crystal resonator unit 400 is mounted such that the outer main surface 465 of the second exterior member 460 opposes a mounting surface 490A of the external substrate 490. That is, the quartz crystal resonator unit 400 is horizontally mounted such that the quartz crystal substrate 410 lies on the external substrate 490. The bonding portion 429A of the first outer electrode 429 is bonded to solder 491, while the bonding portion 439A of the second outer electrode 439 is bonded to solder 492.

With this configuration, the area of the first and second outer electrodes 429 and 439 can be increased, thereby improving the bonding strength between the quartz crystal resonator unit 400 and the external substrate 490. It is also possible to enhance the stability of electrical connection between the quartz crystal resonator unit 400 and the external substrate 490. The quartz crystal resonator unit 400 is horizontally placed. The excitation portion is thus deformed only by a small amount in response to a load applied in a direction normal to the mounting surface 490A of the external substrate 490. That is, the resonance characteristics of the quartz crystal resonator unit 400 are less likely to be changed in response to a load applied in a direction normal to the mounting surface 490A of the external substrate 490. Accordingly, the horizontally placed quartz crystal resonator unit 400 can thus be suitably used as a timing device, which requires stable resonance characteristics, or as a reference for a load sensor.

Fifth Exemplary Embodiment

Figure 10:
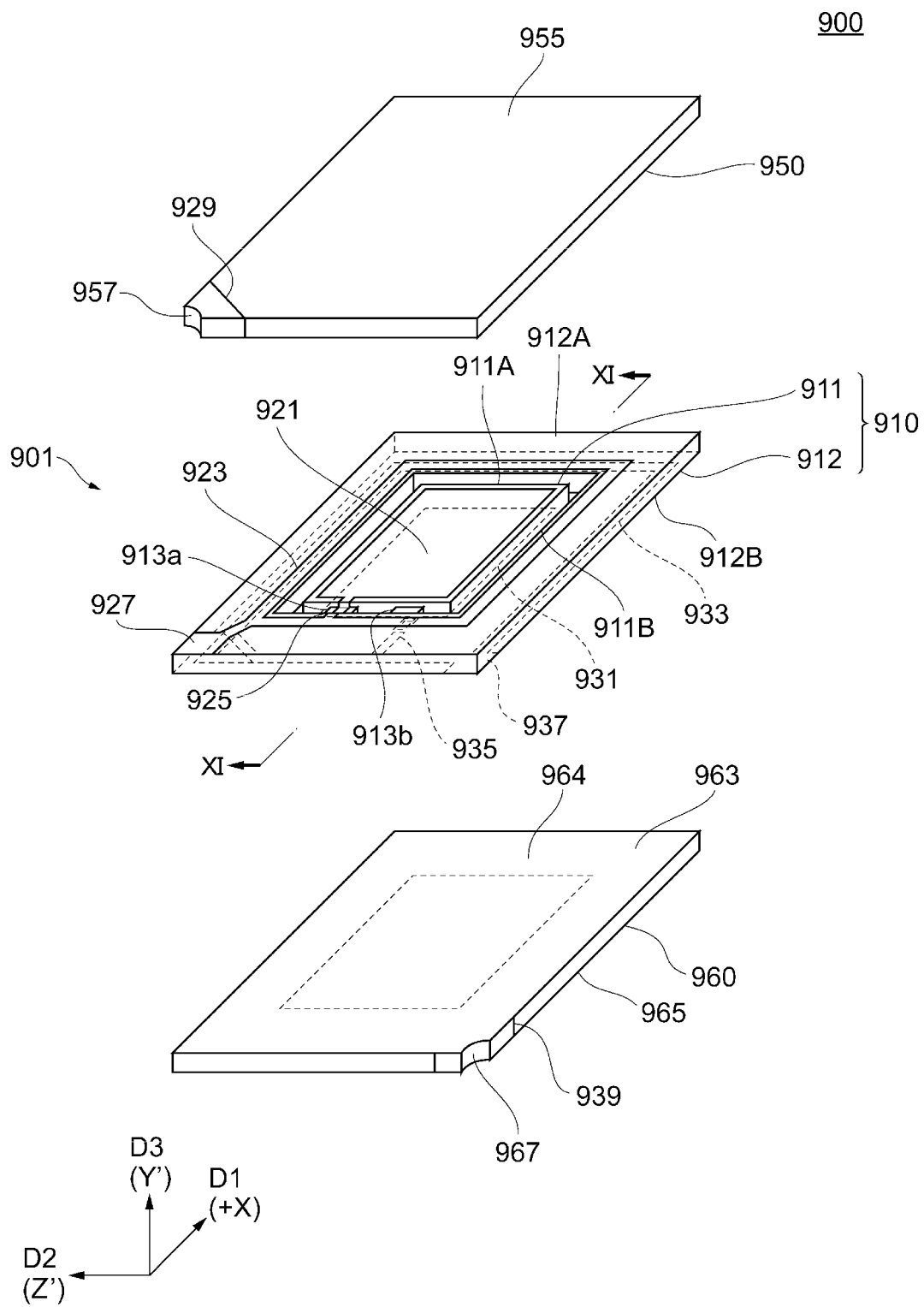
FIG. 10 is an exploded perspective view schematically illustrating the configuration of a quartz crystal resonator unit according to a fifth exemplary embodiment.

The configuration of a quartz crystal resonator unit 900 according to a fifth embodiment will be discussed below with reference to FIGS. 10 and 11. FIG. 10 is an exploded perspective view schematically illustrating the configuration of the quartz crystal resonator unit according to the fifth embodiment. FIG. 11 is a sectional view schematically illustrating the configuration of the quartz crystal resonator unit according to the fifth embodiment.

The quartz crystal resonator unit 900 includes a quartz crystal resonator 901 and first and second exterior members 950 and 960.

The quartz crystal resonator 901 includes a quartz crystal substrate 910 constituted by an excitation portion 911 and a peripheral portion 912. According to the exemplary embodiment, a slit is formed between the excitation portion 911 and the peripheral portion 912. The excitation portion 911 has first and second main surfaces 911A and 911B. The peripheral portion 912 has first and second main surfaces 912A and 912B. The first main surface 911A and the first main surface 912A are located closer to the first exterior member 950. The second main surface 911B and the second main surface 912B are located closer to the second exterior member 960.

In a plan view of the first main surface 911A of the excitation portion 911, the excitation portion 911 has a rectangular shape having a long side along the first direction D1 and a short side along the second direction D2. As further shown, the peripheral portion 912 surrounds the excitation portion 911 with a gap therebetween and has a rectangular frame-like shape having a long side along the first direction D1 and a short side along the second direction D2. The thickness of the peripheral portion 912 along the third direction D3 (hereinafter simply called "the thickness of the peripheral portion 912") is greater than that of the excitation portion 911. The first main surface 912A of the peripheral portion 912 is located closer to the first exterior member 950 than the first main surface 911A of the excitation portion 911. The second main surface 912B of the peripheral portion 912 is located closer to the second exterior member 960 than the second main surface 911B of the excitation portion 911.

Forming of a slit in the quartz crystal substrate 910 can improve the efficiency of trapping the resonance generated in the excitation portion 911. The excitation portion 911 is free to be displaced and deformed, which would be restricted if it is provided continuously from the peripheral portion 912. That is, the excitation portion 911 can be displaced and deformed more flexibly. It is also possible to reduce the transmission of the unwanted resonance produced in the peripheral portion 912 to the excitation portion 911. Because of the above-described reasons, the resonance characteristics of the quartz crystal resonator unit 900 can be improved. By the provision of a slit in the quartz crystal substrate 910, the excitation portion 911 is deformed only by a small amount in response to an external load applied to the quartz crystal resonator unit 900. Moreover, the resonance characteristics of the quartz crystal resonator unit 900 are thus less likely to be changed in response to a load. As a result, the quartz crystal resonator unit 900 can be suitably used as a timing device, which requires stable resonance characteristics.

The excitation portion 911 is supported by the peripheral portion 912 via first and second support portions 913a and 913b that are connected to the short side of the peripheral portion 912 on the negative side of the first direction D1. The first and second support portions 913a and 913b extend in the first direction D1 and are arranged in the second direction D2. The thickness of the first and second support portions 913a and 913b along the third direction D3 is smaller than that of the excitation portion 911. This can improve the efficiency of trapping the resonance generated in the excitation portion 911. The thickness of the first and second support portions 913a and 913b is smaller than that of the peripheral portion 912. This can reduce the transmission of the unwanted resonance produced in the peripheral portion 912 to the excitation portion 911.

Moreover, a first excitation electrode 921 is provided on the first main surface 911A of the excitation portion 911, while a second excitation electrode 931 is provided on the second main surface 911B of the excitation portion 911. A first conductive sealing member 923 and a first connecting electrode 927 are disposed on the first main surface 912A of the peripheral portion 912, while a second conductive sealing member 933 and a second connecting electrode 937 are disposed on the second main surface 912B of the peripheral portion 912. A first extended electrode 925 extends on the surface of the first support portion 913a and electrically connects the first excitation electrode 921 and the first conductive sealing member 923. A second extended electrode 935 extends on the surface of the second support portion 913b and electrically connects the second excitation electrode 931 and the second conductive sealing member 933.

According to the exemplary aspect, the first and second exterior members 950 and 960 are formed in a planar shape. An inner surface 954 and an opposing surface 953 of the first exterior member 950 form the same plane parallel with an outer main surface 955. An inner surface 964 and an opposing surface 963 of the second exterior member 960 form the same plane parallel with an outer main surface 965. A first terminal portion 957 is formed at a corner of the first exterior member 950, while a second terminal portion 967 is formed at a corner of the second exterior member 960. A first outer electrode 929 is disposed on the first terminal portion 957 and covers part of the first connecting electrode 927, which is exposed by the first terminal portion 957. A second outer electrode 939 is disposed on the second terminal portion 967 and covers part of the second connecting electrode 937, which is exposed by the second terminal portion 967. The first and second exterior members 950 and 960 are not restricted to a particular shape and may be formed in a recessed shape, that is, in a box-like shape opened toward the quartz crystal substrate 910.

As described above, according to an exemplary aspect of the present invention, a quartz crystal resonator unit 100 is provided that includes a quartz crystal substrate 110, first and second excitation electrodes 121 and 131, first and second conductive sealing members 123 and 133, and first and second exterior members 150 and 160. The quartz crystal substrate 110 has first and second main surfaces 110A and 110B opposing each other. The first excitation electrode 121 is disposed on the first main surface 110A of the quartz crystal substrate 110. The second excitation electrode 131 is disposed on the second main surface 110B of the quartz crystal substrate 110 and opposes the first excitation electrode 121 with the quartz crystal substrate 110 interposed therebetween. The first conductive sealing member 123 is disposed on the first main surface 110A of the quartz crystal substrate 110 and surrounds the first excitation electrode 121. The second conductive sealing member 133 is disposed on the second main surface 110B of the quartz crystal substrate 110 and surrounds the second excitation electrode 131. The first exterior member 150 is bonded to the quartz crystal substrate 110 with the first conductive sealing member 123 interposed therebetween and covers the first excitation electrode 121 with a space between the first exterior member 150 and the first excitation electrode 121. The second exterior member 160 is bonded to the quartz crystal substrate 110 with the second conductive sealing member 133 interposed therebetween and covers the second excitation electrode 131 with a space between the second exterior member 160 and the second excitation electrode 131. Moreover, a first extended electrode 125 is disposed on the first main surface 110A of the quartz crystal substrate 110. The first extended electrode 125 electrically connects the first excitation electrode 121 and the first conductive sealing member 123 with each other. A second extended electrode 135 is disposed on the second main surface 110B of the quartz crystal substrate 110. The second extended electrode 135 electrically connects the second excitation electrode 131 and the second conductive sealing member 133 with each other. In a plan view of the first main surface 110A of the quartz crystal substrate 110, at least part of the first conductive sealing member 123 is located outward of the second conductive sealing member 133, and the first extended electrode 125 intersects the second conductive sealing member 133 with the quartz crystal substrate 110 interposed therebetween.

According to the above-described exemplary embodiment, the provision of via-electrodes passing through the quartz crystal substrate is not necessary, thereby making it possible to reduce the size of the quartz crystal resonator unit and also making it less likely to decrease the mechanical strength of the quartz crystal substrate. The quartz crystal substrate and the exterior members are bonded to each other via the conductive sealing members, thereby improving the air tightness within the inner spaces surrounding the excitation portion. At the same time, at the peripheral portion of the quartz crystal substrate, the area by which the electrode group on the first main surface and that of the second main surface oppose each other with the quartz crystal substrate interposed therebetween can be reduced. This can regulate the occurrence of the unwanted resonance at the peripheral portion when the excitation portion is excited to produce resonance, and can thus reduce the unwanted resonance to be added to the resonance generated in the excitation portion. As a result, it is possible to provide a quartz crystal resonator unit that can be reduced in size and also makes it less likely to degrade the resonance characteristics.

In a plan view of the first main surface 110A of the quartz crystal substrate 110, the first conductive sealing member 123 is located outward of the second conductive sealing member 133 so that the first conductive sealing member 123 does not overlap the second conductive sealing member 133 in the thickness direction (i.e., orthogonal to the first main surface 110A of the quartz crystal substrate 110). This configuration can reduce the occurrence of the unwanted resonance between the conductive sealing members.

In a plan view of the first main surface 210A of the quartz crystal substrate 210, the first conductive sealing member 223 may be partially located outward of the second conductive sealing member 233 so that the first conductive sealing member 223 does not overlap the second conductive sealing member 233. The first conductive sealing member 223 may intersect the second conductive sealing member 233 with the quartz crystal substrate 210 interposed therebetween. With this configuration, too, the area by which the electrode groups oppose each other at the peripheral portion can be reduced, compared with the configuration in which conductive sealing members oppose each other all around a quartz crystal substrate, for example. That is, the occurrence of the unwanted resonance at the peripheral portion can be decreased, thereby reducing the unwanted resonance to be added to the resonance generated in the excitation portion.

A first connecting electrode 127 may also be disposed on the first main surface 110A of the quartz crystal substrate 110. The first connecting electrode 127 is electrically connected to the first conductive sealing member 123 and extends at an end portion of the quartz crystal substrate 110. A second connecting electrode 137 may also be disposed on the second main surface 110B of the quartz crystal substrate 110. The second connecting electrode 137 is electrically connected to the second conductive sealing member 133 and extends at an end portion of the quartz crystal substrate 110. In a plan view of the first main surface 110A of the quartz crystal substrate 110, the first and second connecting electrodes 127 and 137 may be disposed at different positions. With this configuration, the first extended electrode and the first connecting electrode on the first main surface are separated from the second extended electrode and the second connecting electrode on the second main surface, thereby reducing the occurrence of unwanted resonance at the peripheral portion. Additionally, the connecting electrodes are separated from the excitation portion, thereby reducing a leakage of the resonance generated in the excitation portion via the connecting electrodes.

A third extended electrode 136 may also be disposed on the second main surface 110B of the quartz crystal substrate 110. The third extended electrode 136 electrically connects the second conductive sealing member 133 and the second connecting electrode 137 with each other. The third extended electrode 136 may intersect the first conductive sealing member 123 with the quartz crystal substrate 110 interposed therebetween. This configuration can reduce the area by which the electrode group on the second main surface and the first conductive sealing member oppose each other at the peripheral portion. That is, the occurrence of the unwanted resonance at the peripheral portion can be decreased, thereby reducing the unwanted resonance to be added to the resonance generated in the excitation portion.

Moreover, a position of a connecting portion between the second conductive sealing member 333 and the third extended electrode 336 may be different from a position of a connecting portion between the second conductive sealing member 333 and the second extended electrode 335. With this arrangement, in the area between the excitation portion and a portion at which unwanted resonance is produced, an unwanted-resonance transmission path constituted by the electrode group on the second main surface can be made longer. It is thus possible to reduce the unwanted resonance to be added to the resonance generated in the excitation portion. It is also possible to reduce a leakage of resonance generated in the excitation portion, which may occur as a result of the resonance being transmitted through the electrode group on the second main surface.

The quartz crystal resonator unit 100 may further include first and second outer electrodes 129 and 139. The first outer electrode 129 is disposed at least on a side surface 156 of the first exterior member 150 and is electrically connected to the first connecting electrode 127. The second outer electrode 139 is disposed at least on a side surface 166 of the second exterior member 160 and is electrically connected to the second connecting electrode 137. This configuration makes it possible to electrically connect the outer electrodes to the connecting electrodes without providing via-electrodes in the exterior members. It is thus possible to reduce the size of the quartz crystal resonator unit and also makes it less likely to decrease the mechanical strength of the quartz crystal resonator unit. Additionally, a leakage through viaholes does not occur, thereby maintaining the air tightness within the inner spaces surrounding the excitation portion.

In addition, the first outer electrode 129 may cover at least part the first connecting electrode 127, which is an exposed portion of the first connecting electrode 127 protruding from an end portion of the first exterior member 150. The second outer electrode 139 may cover at least part the second connecting electrode 137, which is an exposed portion of the second connecting electrode 137 protruding from an end portion of the second exterior member 160. This configuration can increase the contact area between the outer electrodes and the connecting electrodes, thereby improving the stability of electrical connection therebetween.

The quartz crystal substrate 110 may have an externally rectangular shape in a plan view of the first main surface. In a plan view of the first main surface 110A of the quartz crystal substrate 110, the first outer electrode 129 may be disposed at one corner of the quartz crystal substrate 110, and the second outer electrode 139 may be disposed at another corner of the quartz crystal substrate 110. With this arrangement, the overlapping portions of the connecting electrodes with the outer electrodes are separated from the excitation portion, thereby reducing a leakage of the resonance generated in the excitation portion via the outer electrodes.

Yet further, the quartz crystal substrate 110 may have an externally rectangular shape in a plan view of the first main surface 110A. In a plan view of the first main surface 110A of the quartz crystal substrate 110, the first and second outer electrodes 129 and 139 may be disposed on the same side of the quartz crystal substrate 110. This makes it possible to mount the quartz crystal resonator unit vertically on an external substrate in a state in which the outer side surfaces of the exterior members oppose the external substrate and the main surfaces of the quartz crystal substrate are substantially perpendicular to the mounting surface of the external substrate. This configuration can reduce the mounting area of the quartz crystal resonator unit. Additionally, when a load is applied to the vertically placed quartz crystal resonator unit in a direction normal to the mounting surface of the external substrate, the excitation portion of the quartz crystal substrate is deformed, and the resonance characteristics of the quartz crystal resonator unit are changed. Hence, the quartz crystal resonator unit can be suitably used as a load sensor.

The first and second outer electrodes 429 and 439 may extend on an outer main surface 465 of the first exterior member 450 or the second exterior member 460, the outer main surface 465 facing a side opposite the quartz crystal substrate 410. With this configuration, the quartz crystal resonator unit can be horizontally placed on an external substrate in a state in which the outer main surface of the exterior member opposes the external substrate. This can increase the area by which the outer electrodes contact solder so as to improve the bonding strength between the quartz crystal resonator unit and the external substrate. It is also possible to enhance the stability of electrical connection between the quartz crystal resonator unit and the external substrate. In the horizontally placed quartz crystal resonator unit, the excitation portion of the quartz crystal substrate is deformed only by a small amount in response to a load applied in a direction normal to the mounting surface of the external substrate. Hence, the quartz crystal resonator unit can be suitably used as a timing device, which requires stable resonance characteristics, or as a reference for a load sensor.

The quartz crystal substrate 110 may be formed in a planar shape such that a region where the first excitation electrode 121 is disposed and a region where the first conductive sealing member 123 is disposed are continuously provided. With this configuration, a load applied to the peripheral portion of the quartz crystal substrate is transmitted to the excitation portion and deforms it. Hence, the quartz crystal resonator unit can be suitably used as a load sensor.

In one exemplary aspect of the quartz crystal substrate 910, a slit is formed between a region where the first excitation electrode 921 is disposed and a region where the first conductive sealing member 923 is disposed. With this configuration, the excitation portion can be displaced and deformed more flexibly. Additionally, a leakage of the resonance generated in the excitation portion of the quartz crystal substrate to the peripheral portion can be reduced, thereby improving the efficiency of trapping the resonance within the excitation portion. It is also possible to reduce the transmission of the unwanted resonance produced in the peripheral portion to the excitation portion. That is, the resonance characteristics of the quartz crystal resonator unit can be improved. Additionally, the excitation portion is less likely to be deformed in response to an external load. That is, the resonance characteristics of the quartz crystal resonator unit are less likely to be changed in response to a load. Hence, the quartz crystal resonator unit can be suitably used as a timing device, which requires stable resonance characteristics, or as a reference for a load sensor.

Finally, it is reiterated that at least one of the first and second exterior members 150 and 160 may be made of the same material as the quartz crystal substrate 110. This configuration can reduce the occurrence of distortion caused by the difference in the coefficient of thermal expansion between the exterior member and the quartz crystal substrate. That is, the resonance characteristics are less likely to be changed by the thermal history of the quartz crystal resonator unit.

As described above, according to an exemplary aspect of the present invention, provide a quartz crystal resonator unit is provided that is reduced in size and is less likely to degrade the resonance characteristics.

The above-described exemplary embodiments are provided for facilitating the understanding of the invention, but are not intended to be exhaustive or to limit the invention to the precise forms disclosed. It should be appreciated that modifications and/or improvements may be made without departing from the scope and spirit of the invention, and equivalents of the invention are also encompassed in the invention. That is, suitable design changes made to the embodiments by those skilled in the art are also encompassed in the invention within the scope and spirit of the invention. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the invention within the scope and spirit of the invention.

REFERENCE SIGNS LIST 100 quartz crystal resonator unit
101 quartz crystal resonator
110 quartz crystal substrate
110A, 110B main surface 121, 131 excitation electrode
123, 133 conductive sealing member
125, 135, 136 extended electrode
127, 137 connecting electrode
129, 139 outer electrode
150, 160 exterior member
151, 161 top wall portion
152, 162 side wall portion
153, 163 opposing surface
154, 164 inner surface
155, 165 outer main surface
156, 166 outer side surface
157, 167 terminal portion

The invention claimed is:

1. A quartz crystal resonator unit comprising:
a quartz crystal substrate having first and second main surfaces that oppose each other;
a first excitation electrode disposed on the first main surface of the quartz crystal substrate;
a second excitation electrode disposed on the second main surface of the quartz crystal substrate and opposing the first excitation electrode with the quartz crystal substrate interposed therebetween;
a first conductive sealing member disposed on the first main surface of the quartz crystal substrate and surrounding the first excitation electrode;
a second conductive sealing member disposed on the second main surface of the quartz crystal substrate and surrounding the second excitation electrode;
a first exterior member bonded to the quartz crystal substrate with the first conductive sealing member interposed therebetween, such that the first exterior member covers the first excitation electrode; and
a second exterior member bonded to the quartz crystal substrate with the second conductive sealing member interposed therebetween, such that the second exterior member covers the second excitation electrode;
a first extended electrode disposed on the first main surface of the quartz crystal substrate and electrically connecting the first excitation electrode to the first conductive sealing member;
a second extended electrode disposed on the second main surface of the quartz crystal substrate and electrically connecting the second excitation electrode to the second conductive sealing member;
a first connecting electrode electrically connected to the first conductive sealing member, with the first connecting electrode disposed on the first main surface of the quartz crystal substrate and extending at an end portion of the quartz crystal substrate; and
a second connecting electrode electrically connected to the second conductive sealing member, with the second connecting electrode disposed on the second main surface of the quartz crystal substrate and extending at an end portion of the quartz crystal substrate,
wherein the first and second connecting electrodes are disposed at different positions in a plan view of the first main surface of the quartz crystal substrate,
wherein at least part of the first conductive sealing member is located outward of the second conductive sealing member in the plan view of the first main surface of the quartz crystal substrate, and
wherein, in the plan view of the first main surface of the quartz crystal substrate, the first extended electrode intersects the second conductive sealing member with the quartz crystal substrate interposed therebetween.

2. The quartz crystal resonator unit according to claim 1, wherein the first conductive sealing member is located outward of the second conductive sealing member so that the first conductive sealing member does not overlap the second conductive sealing member in the plan view of the first main surface of the quartz crystal substrate.

3. The quartz crystal resonator unit according to claim 1, further comprising a third extended electrode disposed on the second main surface of the quartz crystal substrate and that electrically connects the second conductive sealing member to the second connecting electrode.

4. The quartz crystal resonator unit according to claim 3, wherein the third extended electrode intersects the first conductive sealing member with the quartz crystal substrate interposed therebetween in the plan view of the first main surface of the quartz crystal substrate.

5. The quartz crystal resonator unit according to claim 4, wherein a connecting portion between the second conductive sealing member and the third extended electrode is disposed at a position different from a position of a connecting portion between the second conductive sealing member and the second extended electrode.

6. The quartz crystal resonator unit according to claim 1, further comprising:
a first outer electrode disposed at least on a side surface of the first exterior member and electrically connected to the first connecting electrode; and
a second outer electrode disposed at least on a side surface of the second exterior member and electrically connected to the second connecting electrode.

7. The quartz crystal resonator unit according to claim 6, wherein the first outer electrode covers at least part of the first connecting electrode that is an exposed portion that protrudes from an end portion of the first exterior member, and
wherein the second outer electrode covers at least part of the second connecting electrode that is an exposed portion that protrudes from an end portion of the second exterior member.

8. The quartz crystal resonator unit according to claim 7, wherein the quartz crystal substrate comprises an externally rectangular shape in the plan view of the first main surface, and
wherein, in the plan view of the first main surface of the quartz crystal substrate, the first outer electrode is disposed at one corner of the quartz crystal substrate, and the second outer electrode is disposed at another corner of the quartz crystal substrate.

9. The quartz crystal resonator unit according to claim 7, wherein the quartz crystal substrate has an externally rectangular shape in the plan view of the first main surface, and
wherein, in the plan view of the first main surface of the quartz crystal substrate, the first and second outer electrodes are disposed on the same side of the quartz crystal substrate.

10. The quartz crystal resonator unit according to claim 6, wherein the first outer electrode extends on an outer main surface of the first exterior member that faces a side opposite the quartz crystal substrate.

11. The quartz crystal resonator unit according to claim 1, wherein the quartz crystal substrate comprises a planar shape such that the first excitation electrode is disposed in a region that is continuous to a region where the first conductive sealing member is disposed.

12. The quartz crystal resonator unit according to claim 1, further comprising a slit in the quartz crystal substrate that is between a region where the first excitation electrode is disposed and a region where the first conductive sealing member is disposed.

13. The quartz crystal resonator unit according to claim 1, wherein at least one of the first and second exterior members comprises a same material as the quartz crystal substrate.

14. A quartz crystal resonator unit comprising:
a quartz crystal substrate having first and second main surfaces that oppose each other;
an first excitation electrode and a first conductive sealing member disposed on the first main surface of the quartz crystal substrate, with the first conductive sealing member electrically connected to the first excitation electrode and surrounding the first excitation electrode in a plan view of the first main surface;
a second excitation electrode and a second conductive sealing member disposed on the second main surface of the quartz crystal substrate, with the second conductive sealing member electrically connected to the second excitation electrode and surrounding the second excitation electrode in a plan view of the second main surface;
a first exterior member bonded to the quartz crystal substrate with the first conductive sealing member interposed therebetween, such that the first exterior member covers the first excitation electrode with a space therebetween;
a second exterior member bonded to the quartz crystal substrate with the second conductive sealing member interposed therebetween, such that the second exterior member covers the second excitation electrode with a space therebetween;
a first outer electrode disposed at least on a side surface of the first exterior member and electrically connected to the first conductive sealing member; and
a second outer electrode disposed at least on a side surface of the second exterior member and electrically connected to the second conductive sealing member,
wherein the first outer electrode covers at least part of a first connecting electrode that is an exposed portion that protrudes from an end portion of the first exterior member and is connected to the first conductive sealing member,
wherein the second outer electrode covers at least part of a second connecting electrode that is an exposed portion that protrudes from an end portion of the second exterior member and is connected to the second conductive sealing member, and
wherein the first conductive sealing member is located outward of and surrounds the second conductive sealing member relative to the plan views of the first and second main surfaces of the quartz crystal substrate.

15. The quartz crystal resonator unit according to claim 14, further comprising:
a first linear electrode disposed on the first main surface of the quartz crystal substrate and electrically connecting the first excitation electrode to the first conductive sealing member; and
a second linear electrode disposed on the second main surface of the quartz crystal substrate and electrically connecting the second excitation electrode to the second conductive sealing member,
wherein the first linear electrode intersects the second conductive sealing member in the plan view of the first main surface of the quartz crystal substrate.

16. The quartz crystal resonator unit according to claim 14, wherein the first conductive sealing member is located outward of the second conductive sealing member so that the first conductive sealing member completely does not overlap the second conductive sealing member in the plan view of the first main surface of the quartz crystal substrate.

17. A quartz crystal resonator unit comprising:
a quartz crystal substrate having first and second main surfaces that oppose each other;
a first excitation electrode disposed on the first main surface of the quartz crystal substrate;
a second excitation electrode disposed on the second main surface of the quartz crystal substrate and opposing the first excitation electrode with the quartz crystal substrate interposed therebetween;
a first conductive sealing member disposed on the first main surface of the quartz crystal substrate and surrounding the first excitation electrode;
a second conductive sealing member disposed on the second main surface of the quartz crystal substrate and surrounding the second excitation electrode;
a first exterior member bonded to the quartz crystal substrate with the first conductive sealing member interposed therebetween, such that the first exterior member covers the first excitation electrode; and
a second exterior member bonded to the quartz crystal substrate with the second conductive sealing member interposed therebetween, such that the second exterior member covers the second excitation electrode;
a first extended electrode disposed on the first main surface of the quartz crystal substrate and electrically connecting the first excitation electrode to the first conductive sealing member; and
a second extended electrode disposed on the second main surface of the quartz crystal substrate and electrically connecting the second excitation electrode to the second conductive sealing member;
wherein at least part of the first conductive sealing member is located outward of the second conductive sealing member in a plan view of the first main surface of the quartz crystal substrate,
wherein, in the plan view of the first main surface of the quartz crystal substrate, the first extended electrode intersects the second conductive sealing member with the quartz crystal substrate interposed therebetween,
wherein the first conductive sealing member is partially located outward of the second conductive sealing member so that the first conductive sealing member does not partially overlap the second conductive sealing member in the plan view of the first main surface of the quartz crystal substrate, and
wherein the first conductive sealing member intersects the second conductive sealing member with the quartz crystal substrate interposed therebetween.

* * * * *